US008817449B2

(12) United States Patent
Morimoto et al.

(10) Patent No.: US 8,817,449 B2
(45) Date of Patent: Aug. 26, 2014

(54) SUBSTRATE HOLDING DEVICE (75) Inventors: Naoki Morimoto, Shizuoka (JP);
Masahiko Ishida, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 128 days.

(21) Appl. No.: 13/634,316

(22) PCT Filed: Mar. 16, 2011

(86) PCT No.: PCT/JP2011/001557
§ 371 (c)(1),
(2), (4) Date: Sep. 12, 2012

(87) PCT Pub. No.: WO2011/118159
PCT Pub. Date: Sep. 29, 2011

(65) Prior Publication Data
US 2013/0003250 A1 Jan. 3, 2013

(30) Foreign Application Priority Data

Mar. 26, 2010 (JP) ................................. 2010-073670

(51) Int. Cl.
*H01L 21/683* (2006.01)
(52) U.S. Cl.
CPC ................... *H01L 21/6831* (2013.01)
USPC ........................................................ 361/234
(58) Field of Classification Search
USPC ........................................................ 361/234
See application file for complete search history.

(56) References Cited

U.S. PATENT DOCUMENTS 7,209,339 B2 * 4/2007 Kitabayashi et al. ......... 361/234

FOREIGN PATENT DOCUMENTS

| JP | 01-098218 A | 4/1989 |
|---|---|---|
| JP | 01-321136 A | 12/1989 |
| JP | 07-169825 A | 7/1995 |
| JP | 2000-092877 A | 3/2000 |
| JP | 2006-049352 A | 2/2006 |
| JP | 2010-123810 A | 6/2010 |

OTHER PUBLICATIONS

International Search Report for PCT Patent App. No. PCT/JP2011/001557 (Jun. 7, 2011).

* cited by examiner

*Primary Examiner* — Scott Bauer
(74) *Attorney, Agent, or Firm* — Cermak Nakajima LLP; Tomoko Nakajima (57) ABSTRACT

A substrate holding device for clamping a substrate in a processing chamber in which plasma processing is carried out includes a chuck main body having positive and negative electrodes and, a chuck plate having a rib portion capable of bringing the peripheral edge portion of the substrate into surface contact therewith and multiple support portions provided upright and arranged at predetermined intervals in an internal space surrounded by the rib portion, a DC power supply for applying a DC voltage between the two electrodes, an AC power supply for passing an alternating current through the capacitance of the chuck plate, and first measuring means for measuring the alternating current passing through the capacitance of the chuck plate, and further includes removing means for removing an AC component superimposed on the alternating current from a plasma produced in the processing chamber during plasma processing.

3 Claims, 5 Drawing Sheets

SUBSTRATE HOLDING DEVICE

This application is a national phase entry under 35 U.S.C. §371 of PCT Patent Application No. PCT/JP2011/001557, filed on Mar. 16, 2011, which claims priority under 35 U.S.C. §119 to Japanese Patent Application No. 2010-073670, filed Mar. 26, 2010, both of which are incorporated by reference.

TECHNICAL FIELD

The present invention relates to a substrate holding device using an electrostatic chuck, and particularly to a substrate holding device for clamping and holding a substrate in a processing chamber in which plasma processing is carried out.

BACKGROUND ART

There are known techniques for obtaining a desired device structure in a semiconductor fabrication process as follows: a plasma is produced in a processing chamber in which a silicon wafer (hereinafter referred to as a "wafer") as a substrate to be processed is placed, and plasma processing such as deposition, ion implantation, and etching is carried out on the substrate using the plasma. Such a plasma processing system is provided with a substrate holding device including a so-called electrostatic chuck in order to align and hold a substrate in the processing chamber.

As an electrostatic chuck, a so-called bipolar electrostatic chuck in which a dielectric chuck plate is attached to an upper surface of a chuck main body having positive and negative electrodes embedded therein has been disclosed in, for example, Patent Document 1. Moreover, a substrate held by the substrate holding device is controlled to be at a predetermined temperature in some cases depending on the plasma processing to be carried out in the processing chamber. In such a case, the following chuck has been known: for example, electrical resistance heating means is incorporated in a chuck main body (or pedestal), and a chuck plate is configured such that a rib portion is formed which comes in surface contact with a peripheral edge portion of a back surface (on the opposite side from a surface on which predetermined processing is performed) of a wafer, and that multiple support portions are provided upright and arranged, for example, concentrically in an internal space surrounded by the rib portion.

In this substrate holding device, when the wafer is heated or cooled, an assist gas such as an Ar gas is supplied to the internal space through a gas passage formed in the chuck main body, and a gas atmosphere is formed in the internal space defined by the rib portion and the back surface of the wafer. Thus, heat transfer from the chuck main body to the wafer is assisted, and the wafer can be efficiently heated or cooled. Moreover, depending on the plasma processing, a configuration may be employed in which a bias voltage can be applied to a substrate clamped by a substrate holding device.

In recent years, there has been a trend toward using wafers having large diameters and small thicknesses (700 nm or less) in order to further improve productivity. Such a wafer has warpage, and the warpage state of the wafer is changed by the heating or cooling of the wafer or by stress in a film deposited on a surface of the substrate by plasma processing. In some cases, the warpage state of the wafer is changed by stress in the film even during plasma processing.

If voltages applied to the positive and negative electrodes are fixed in the process of clamping such a warping wafer or during plasma processing, there may arise problems: for example, an alignment failure occurs due to a too weak clamping force in the process of clamping the wafer, and damage is caused due to a too strong clamping force. Also, in the case of a warping wafer, the distance from the upper surface of the chuck main body to the back surface of the substrate varies across the surface of the substrate according to the warpage state of the substrate. Accordingly, the amount of heat transfer through the inert gas atmosphere varies in the process of heating or cooling. As a result, the substrate temperature is non-uniform across the surface of the substrate. When predetermined plasma processing is performed in a state in which the substrate temperature is non-uniform as described above, there is also a problem that the thickness and quality of a film vary.

Accordingly, the inventors of the present invention have proposed that the substrate holding device includes an AC power supply for passing an alternating current through the capacitance of a chuck plate, first measuring means for measuring a current value of the alternating current passing through the capacitance of the chuck plate, second measuring means for measuring a gas flow rate of the gas when the gas is caused to flow by gas introduction means, and control means for controlling a DC voltage applied between the two electrodes so that at least one of the current value and the gas flow rate measured with the first and second measuring means may be in a predetermined range (see Japanese Patent Application No. 2008-297295).

According to this, after a substrate is clamped by the chuck plate, the warpage state of the substrate can always be correctly grasped from the gas flow rate and/or an impedance (alternating current value) even if the substrate has warpage in either direction. Further, the substrate can be clamped with an appropriate clamping force according to the warpage state of the substrate by storing in advance in the control means the gas flow rate range and/or the alternating current value range under the condition in which a substrate is clamped in a warpage-free state, and, based on the ranges, controlling the DC voltage (i.e., the substrate clamping force) applied between the two electrodes so that at least one of the current value and the gas flow rate measured with the first and second measuring means may be in a predetermined range.

However, when the substrate holding device configured as described above is used in a plasma processing system, there are cases where the state of the substrate cannot be monitored based on the impedance. Also, it has been revealed that there is the following problem: even if the DC voltage applied between the two electrodes is controlled based on the amount of change in the impedance, a too strong substrate clamping force may damages this substrate, or a too weak substrate clamping force forms a local gap between the upper surface of the chuck main body and a clamped surface of the substrate, thus inducing an abnormal discharge.

PRIOR ART DOCUMENTS

Patent Documents

Patent Document 1: Japanese Patent Application Publication No. Hei01-321136

SUMMARY OF THE INVENTION

Problems to be Solved by the Invention

In view of the above-described circumstances, an object of the present invention is to provide a substrate holding device which makes it possible to grasp the warpage state of a substrate even during plasma processing and which clamps the substrate with an appropriate clamping force without damaging the substrate and inducing an abnormal discharge.

Means for Solving the Problems

To solve the above-described problems, a substrate holding device of the present invention is a substrate holding device for clamping a substrate in a processing chamber in which plasma processing is carried out, and the substrate holding device includes a chuck main body having positive and negative electrodes, a dielectric chuck plate having a rib portion capable of bringing a peripheral edge portion of the substrate into surface contact therewith and multiple support portions provided upright and arranged at predetermined intervals in an internal space surrounded by the rib portion, a DC power supply for applying a DC voltage between the two electrodes, an AC power supply for passing an alternating current through capacitance of the chuck plate, and first measuring means for measuring the alternating current passing through the capacitance of the chuck plate, and further includes removing means for removing an AC component superimposed on the alternating current from a plasma produced in the processing chamber during the plasma processing.

According to the present invention, in the case where a substrate to be clamped has warpage in, for example, such a direction (compressive direction) that a central portion thereof moves away from the internal space, the capacitance varies. This causes the impedance value to vary, and causes an alternating current value measured with the first measuring means to vary. Accordingly, when the substrate is clamped by the chuck plate, the state of the substrate is correctly grasped from the impedance, and by extension, the alternating current value. The substrate is clamped with a clamping force according to the state of the substrate, i.e., with the DC voltage controlled based on the alternating current value under the condition in which a substrate is clamped in a warpage-free state.

Next, plasma processing is carried out on the substrate clamped and held by the substrate holding device as described above. During this plasma processing, also, the alternating current value is measured with the first measuring means. Here, a research by the inventors of the present invention has revealed that during plasma processing, since an AC component in a plasma is superimposed on an alternating current for grasping the state of the substrate, the impedance value greatly varies.

Accordingly, in the present invention, since the removing means is provided which removes the AC component superimposed on the alternating current from the plasma produced in the processing chamber, the amount of variation in the impedance during plasma processing can be reduced. As a result, even in the case where the substrate warps due to, for example, stress in a film formed on a surface of the substrate by plasma processing, great variations in the impedance value can be easily grasped from the above-described amount of variation. Thus, the state of the substrate can be reliably monitored.

Moreover, in the present invention, the following configuration may be employed: the substrate holding device further includes control means for controlling operation of the DC power supply and the AC power supply, and the control means controls the DC voltage applied between the two electrodes so that an alternating current value measured with the first measuring means may be in a predetermined range. In this configuration, based on variations in the impedance value during plasma processing, the substrate can be clamped with an optimum clamping force according to the warpage of the substrate. As a result, it is possible to prevent damage to the substrate and the induction of an abnormal discharge during the plasma processing. Also, when the present invention is used in, for example, deposition by sputtering, since the substrate is held in a warpage-free state, the distance from a target to a surface of the substrate is approximately uniform across the entire surface of the substrate. Thus, the uniformity of film thickness across the surface of the substrate can also be improved.

Furthermore, in the present invention, the following configuration may be employed: the substrate holding device further includes gas introduction means for introducing a predetermined gas into the internal space and second measuring means for measuring a gas flow rate of the gas introduced into the internal space, and the control means controls the DC voltage applied between the two electrodes so that the gas flow rate measured with the second measuring means may be in a predetermined range. In this configuration, when a substrate to be clamped warps during plasma processing in such a direction (tensile direction) that a gap between the rib portion and the periphery of the surface of the substrate increases, the amount of leakage of the gas from the internal space through the gap changes, and this causes the gas flow rate measured with the second measuring means to vary. In such a case, by controlling the DC voltage applied between the two electrodes based on the gas flow rate under the condition in which a substrate is clamped in a warpage-free state, the plasma processing can be performed with the substrate clamped with an appropriate electric power for clamping.

In the present invention, the removing means may be any one of a filter circuit for removing AC components of specific frequency band and a digital signal processor which functions as a filter for removing AC components of specific frequencies.

MODES FOR CARRYING OUT THE INVENTION

Hereinafter, referring to the drawings, a substrate holding device EC of this embodiment which is placed in a plasma processing system will be described with a substrate to be processed assumed to be a wafer W. Here, a plasma processing system in which the substrate holding device EC of this embodiment is used may be a publicly-known plasma processing system such as a DC or AC sputtering system or a reactive ion etching system irrespective of a method for producing a plasma atmosphere in the processing chamber, and therefore will not be describe in detail here.

Figure 1:
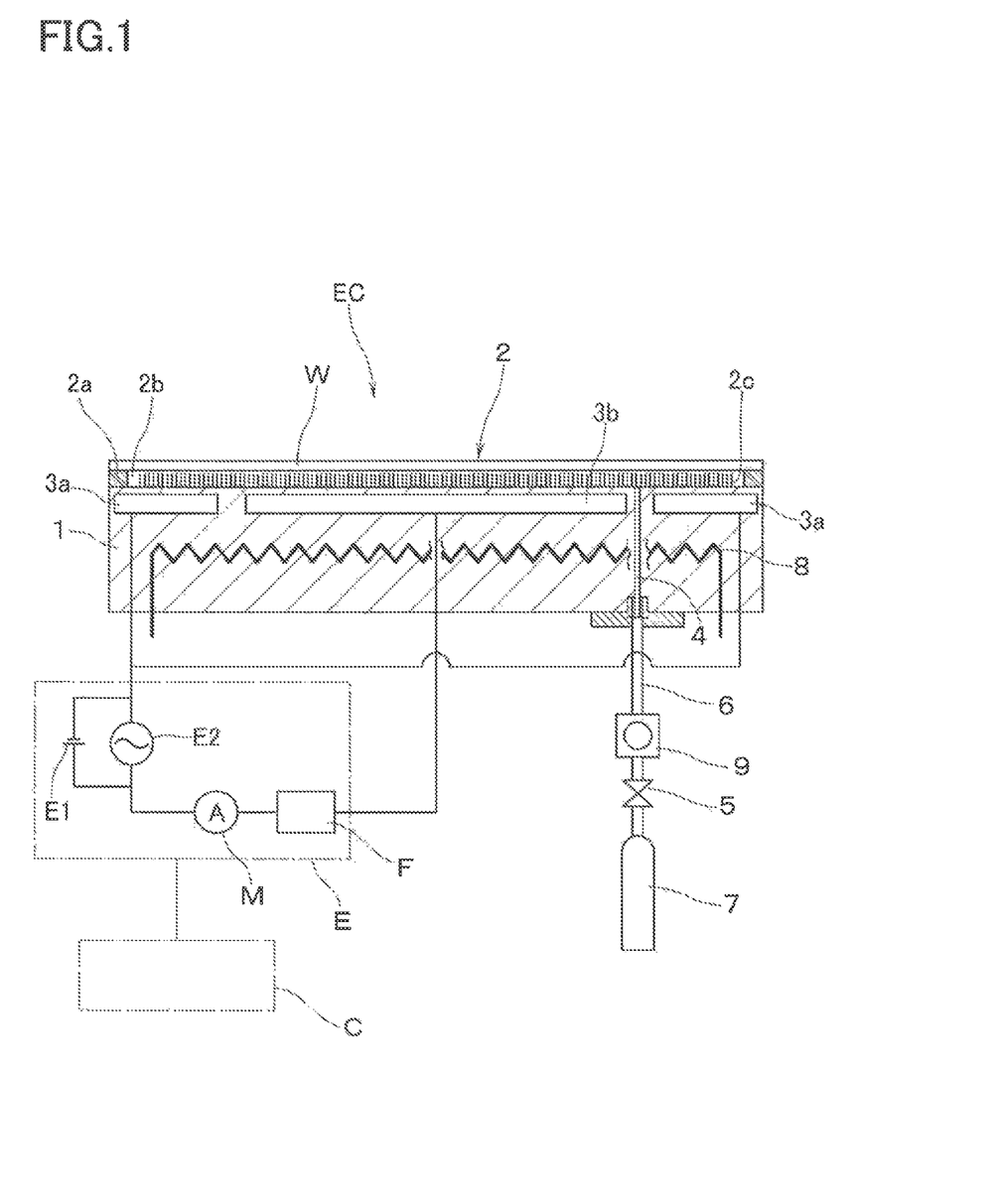
FIG. 1 is a view for schematically explaining the configuration of an electrostatic chuck of an embodiment of the present invention.

As shown in FIG. 1, the substrate holding device EC is a so-called electrostatic chuck, and includes a chuck main body 1 placed on a bottom portion in an unillustrated processing chamber directly or with a pedestal interposed therebetween and a dielectric chuck plate 2 provided on an upper surface of the chuck main body 1. The chuck main body 1 is made of, for example, aluminum nitride, and has positive and negative electrodes 3a and 3b embedded therein with an unillustrated insulating layer interposed therebetween. A DC voltage is applied between the two electrodes 3a and 3b from a DC power supply E1 in a power supply circuit E.

Moreover, the chuck main body 1 has a gas passage 4 passing therethrough in the vertical direction. A lower end of the gas passage 4 communicates with a gas source 7 containing an assist gas made of an inert gas with a gas pipe 6 interposed therebetween. The gas pipe 6 has an APC (automatic pressure controller) 5 installed at a point therein. These parts constitute gas introduction means of this embodiment. Furthermore, the chuck main body 1 has an electrical resistance heater 8 incorporated therein so that a wafer W can be heated and maintained at a predetermined temperature. Incidentally, a configuration in which the wafer W can be cooled may also be employed by forming a cooling passage in the chuck main body 1 and circulating a coolant.

The chuck plate 2 is made of, for example, aluminum nitride, and includes a ring-shaped rib portion 2a capable of bringing a peripheral edge portion of a back surface of the wafer W into surface contact therewith, and multiple stick-shaped support portions 2c provided upright and arranged concentrically in an internal space 2b surrounded by the rib portion 2a. Further, after the wafer W is mounted on the chuck plate 2, the wafer W is clamped on a surface of the chuck plate 2 by an electrostatic force generated by applying a DC voltage between the two electrodes 3a and 3b through the DC power supply E1. At this time, the peripheral edge portion of the back surface of the wafer W comes in surface contact with the rib portion 2a throughout the entire circumference thereof, and thus the internal space 2b is approximately hermetically sealed (in this case, the wafer W is approximately parallel to the surface of the chuck plate 2). When the assist gas is supplied by the gas introduction means in this state, a gas atmosphere is formed in the internal space 2b. Thus, by forming the gas atmosphere in the internal space 2b defined by the rib portion 2a and the back surface of the wafer W, heat transfer to the wafer W is assisted, and the wafer W can be efficiently heated or cooled.

In the above-described substrate holding device EC, control means C including a microcomputer and the like performs the following control in an integrated manner: the control of application of voltage from the DC power supply E1 in the chuck power supply E to the two electrodes 3a and 3b, the control of supply of the inert gas by the gas introduction means, and the like. Here, since no seal member is provided between the peripheral edge portion of the back surface of the wafer W and the rib portion 2a, a very small amount (e.g., 0.01 to 0.03 sccm) of the inert gas leaks out even in the case where the peripheral edge portion of the back surface of the wafer W is in surface contact with the rib portion 2a throughout the entire circumference thereof.

Figure 2A:
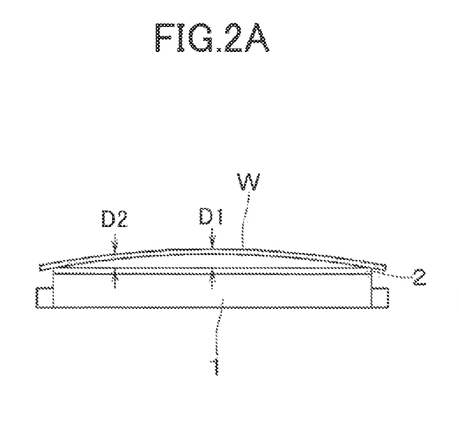
FIGS. 2A and 2B is a view for schematically explaining the warpage of a substrate.
Figure 2B:
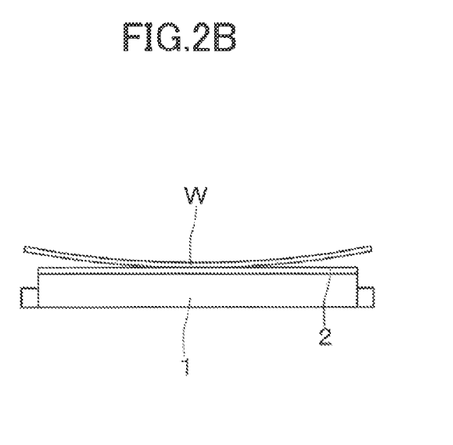

As shown in FIGS. 2A and 2B, the wafer W has warpage in the compressive or tensile direction caused by, for example, stress in the wafer W itself or stress in a film formed on a surface of the wafer W. Accordingly, when the wafer W is clamped in a state in which voltages applied to the two electrodes 3a and 3b are controlled based on a constant set voltage registered in advance in the control means C, the wafer W may clamped by the chuck plate 2 in a warping state, depending on the wafer W.

Here, a description will be made by taking a wafer W having warpage in the compressive direction as an example. Distances D1 and D2 from the upper surface of the chuck main body 1 to the back surface of the wafer on the chuck plate 2 are not equal to each other between a central portion of the wafer W (distance D1) and a peripheral portion of the wafer W (distance D2) (see FIG. 2A). In such a case, when the heater 8 is turned on to heat the wafer W, the amount of heat transfer to the wafer W through the inert gas atmosphere varies across the surface of the wafer W. As a result, the following problem occurs: the temperature of the wafer W is non-uniform across the surface of the wafer W.

Accordingly, the following way has been adopted. An AC power supply E2 is connected to the DC power supply E1 in parallel in the chuck power supply E so that the control means C may cause an alternating current to pass through the capacitance of the electrostatic chuck from the AC power supply E2, and an impedance value is monitored based on a current value measured with a publicly-known ammeter (first measuring means) M. Also, a publicly-known mass flow meter (second measuring means) 9 is installed downstream of the APC 5 at a point in the gas pipe 6 to monitor a gas flow rate. Further, when at least one of the impedance and the gas flow rate varies out of a predetermined range, the control means C changes the clamping voltage from the DC power supply E1 to change the force that clamps the wafer W so that the wafer W may be approximately parallel to the surface of the chuck plate 2, i.e., so that the distances D1 and D2 from the upper surface of the chuck main body 1 to the back surface of the wafer W may be made equal to each other. The control of clamping of a wafer W in the electrostatic chuck EC will be specifically described below.

Prior to plasma processing for a wafer W as a product, a wafer W which is identical to one to be used in processing is mounted on the surface of the chuck plate 2, the wafer W is mounted on the surface of the chuck plate 2, and then an alternating current is caused to flow by the AC power supply E2. Based on the current value at that time, the impedance value of the capacitance is measured. Next, a predetermined DC voltage is applied between the two electrodes 3a and 3b by the DC power supply E1 to clamp the wafer W to the surface of the chuck plate 2. At this time, the DC voltage is controlled so that the entire peripheral edge portion of the back surface of the wafer W may come in surface contact with the rib portion 2a and that the wafer W may be in an approximately horizontal position (see FIG. 1). Further, the impedance value is measured when the wafer W is thus clamped in surface contact. A result of this measurement (reference value) is stored in advance in the control means C. Incidentally, whether or not the wafer W is in an approximately horizontal position can be determined by using, for example, a publicly-known displacement meter.

In this state, an Ar gas is introduced into the internal space 2b at a constant flow rate by the gas introduction means, and the gas flow rate is measured with the mass flow meter 9. The flow rate is initially high, and then shows a constant value with the elapse of time. A result of this measurement (another reference value) is stored in advance in the control means C. Further, based on the above-described reference values, predetermined ranges acceptable for clamping and holding the wafer W in an approximately horizontal position are determined to be stored in the control means C. Thus, preparation for wafer clamping is completed.

Next, a wafer W as a product is transferred onto the chuck plate 2, aligned, and then clamped to the surface of the chuck plate 2. At this time, an alternating current is caused to flow from the AC power supply E2. The impedance at that time is measured with the ammeter M, and the gas flow rate is measured with the mass flow meter 9.

Here, in the case where the wafer W has warpage in the compressive direction, the impedance changes to a high value. On the other hand, in the case where the wafer W has warpage in the tensile direction, even when the wafer W is clamped to the chuck plate 2, the rib portion 2a and the peripheral edge portion of the wafer W do not come in surface contact with each other. The gap therebetween is large, and the gas flow rate of the leaking gas is large. Accordingly, the gas flow rate measured with the mass flow meter 9 changes to a high value. In this way, the warpage state of the wafer W clamped to the chuck plate 2 is grasped.

Next, the control means C determines whether or not the above-described impedance value and gas flow rate are in the above-described predetermined ranges. As a result, if any one of the measurement values is out of the predetermined range, the DC voltage applied between the two electrodes 3a and 3b by the DC power supply E1 is changed by the control means C to be controlled such that the measurement value is in the predetermined range. On the other hand, if each of the measurement values is in the predetermined range, for example, the heater 8 is turned on, and the wafer W is heated to a predetermined temperature (e.g., 400° C.) and maintained at the predetermined temperature. In this state, plasma processing is performed on the wafer W.

During plasma processing, also, measurements are intermittently or continuously made as to whether or not the impedance is in the predetermined range. It has been revealed that there are cases where the state of the wafer W cannot be monitored based on the change of this impedance, and that the force that clamps the wafer W becomes too strong or too weak. This seems to be caused by the following phenomenon: an AC component in a plasma produced in the processing chamber is superimposed on the alternating current, and causes variations in the impedance value. Specifically, a description will be made by taking as an example the case where a film is formed on the wafer W by a DC sputtering system. A sputtering power supply for supplying DC power to a target generally rectifies commercial AC power to convert the AC power to DC power (in some cases, further converts the DC power to AC power again using an inverter and rectifies the output), and then supplies the DC power to the target. Accordingly, when a plasma is produced in the processing chamber, an AC component from the sputtering power supply is contained in the plasma. This AC component is superimposed on the alternating current in the chuck power supply E to cause variations in the impedance value. Such variations in the impedance value also occur in the case where an AC power supply or a high frequency power supply is used as a power supply for producing a plasma or the case where a high frequency power supply is connected to the chuck main body 1 to apply a bias voltage to the substrate.

To confirm the above-described variations in the impedance value, the following experiment was carried out using a publicly-known DC sputtering system provided with the substrate holding device EC having the above-described configuration. Specifically, conditions for sputtering were as follows: a target is made of Ti, the DC power supplied from the sputtering power supply is 18 kW, and the flow rate of an argon gas (sputtering gas) is 8 sccm.

After the wafer W was aligned and placed on the chuck plate 2 of the substrate holding device EC, the DC voltage was applied between the two electrodes 3a and 3b by the DC power supply E1 to clamp the wafer W to the surface of the chuck plate 2. At this time, the voltage from the DC power supply E1 was 0.8 kV, and the gas pressure of the assist gas from the gas introduction means was 400 Pa. The impedance value in this case was approximately 17.5 kΩ (see FIG. 3).

Figure 3:
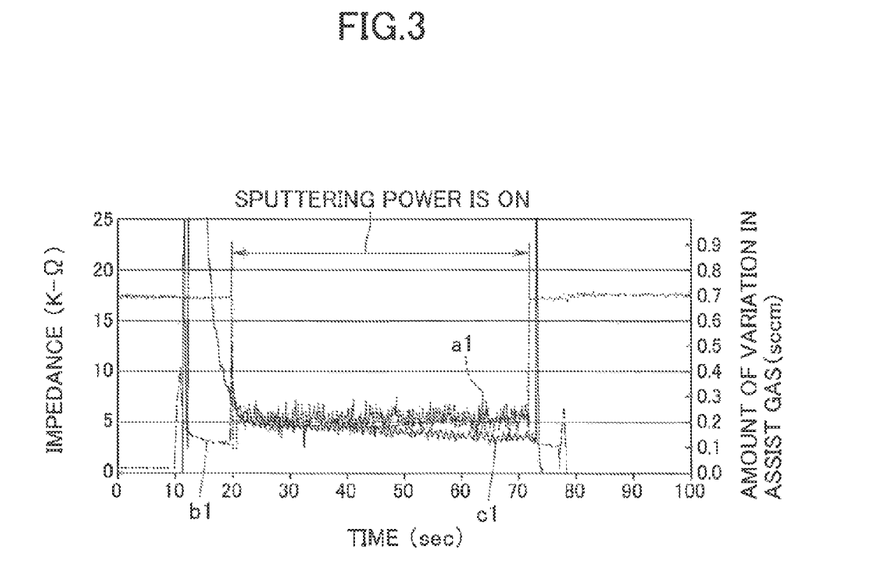
FIG. 3 is a graph showing results of an experiment in which variations in an impedance value, an alternating current value, and the flow rate of an assist gas are measured during plasma processing in the case where a substrate holding device of a prior art is used.

Next, under the above-described conditions, a vacuum chamber is evacuated to a vacuum, argon is introduced thereto, and then the sputtering power supply is turned on to supply power to the target. At this time, the voltages applied from the DC power supply E1 to the two electrodes 3a and 3b are constant. In this case, as shown in FIG. 3, it can be seen that immediately after the beginning of supply of power, the alternating current value measured with the ammeter M starts varying, and the impedance value is as low as approximately 13 kΩ; during the supply of power, the impedance value greatly varies, and gradually decreases with the elapse of time. Here, in FIG. 3, a line a1 indicates the amount of variation in the impedance, a line b1 indicates the amount of variation in the direct current, and a line c1 indicates the amount of variation in the flow rate of the assist gas.

Moreover, the amount of variation in the gas flow rate of the assist gas measured with the mass flow meter 9 also decreases with the elapse of time. Thus, in the above-described experiment, the amount of variation in the impedance value is large. Accordingly, in some cases, a determination cannot be made as to whether or not the wafer W has warped due to stress in a Ti film during deposition. Moreover, since the impedance value becomes small during plasma processing (after the sputtering power supply is turned on), if the DC voltage from the DC power supply E1 is controlled as described above, the force that clamps the wafer W is weakened. In such a case, stress in a film during deposition may cause a clamping failure or induce an abnormal discharge.

Next, using the same sputtering system as described above, dependences on the flow rate (range of 5 to 40 sccm) of the sputtering gas introduced into a plasma atmosphere and the power (range of 5 to 20 kW) supplied to the target have been confirmed. In this experiment, variations in the impedance in the case where a discharge is not allowed to occur in the processing chamber by appropriately controlling the sputtering power supply were also confirmed. As indicated by dotted lines in FIGS. 4A and 4B, this has proved that the impedance value greatly varies with increasing amount of the sputtering gas introduced during sputtering, but the impedance not greatly decreases when the input power is changed.

Figure 4A:
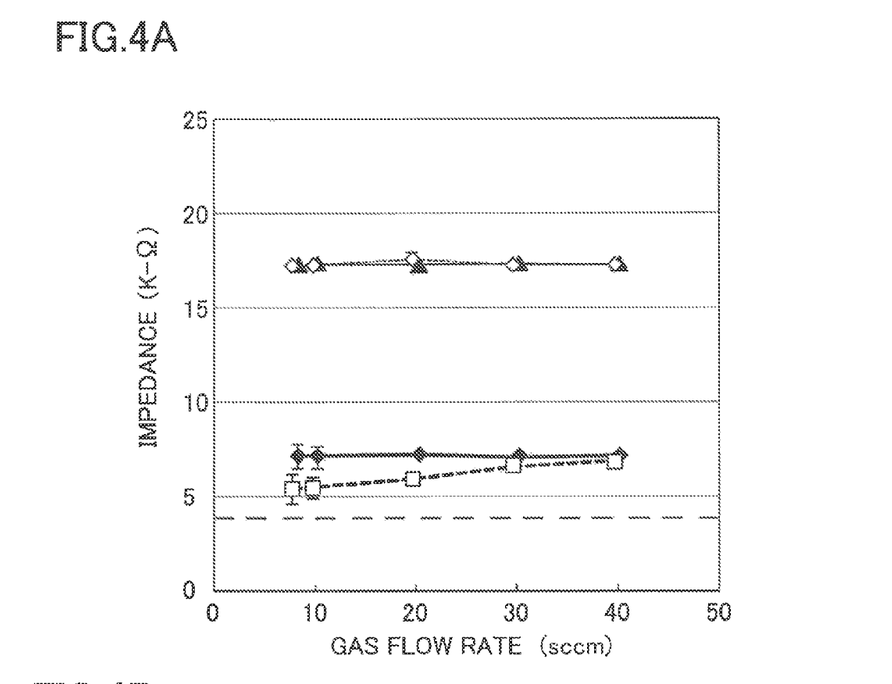
FIGS. 4A and 4B are graphs showing results of an experiment in which the change in an impedance value is measured with respect to the flow rate of gas introduced and power supplied during plasma processing.
Figure 4B:
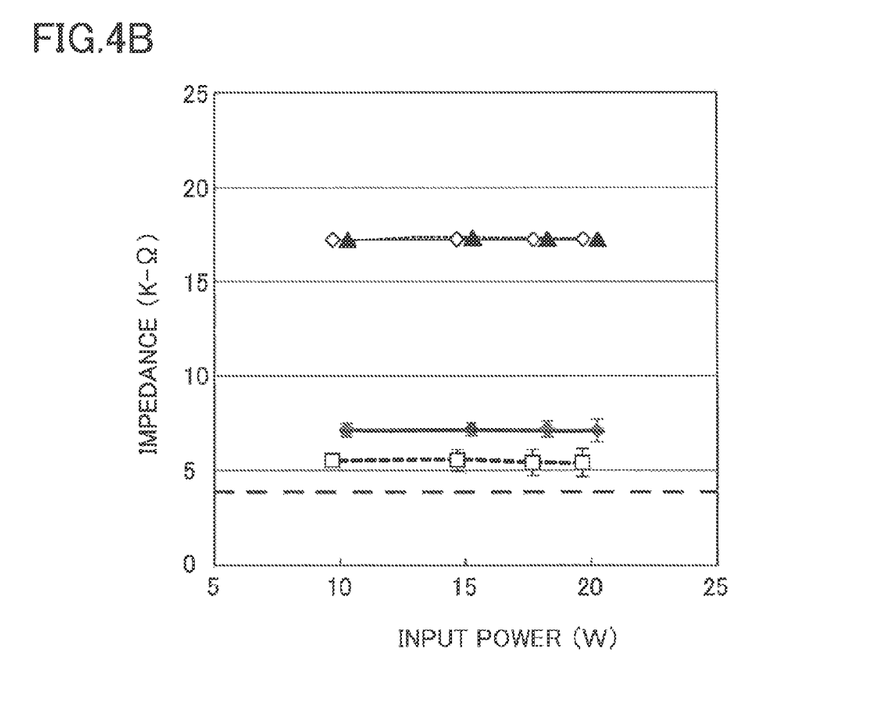

Here, FIG. 4A shows variations in the impedance value when the gas flow rate is changed. In FIG. 4A, a dotted line with open diamonds indicates the case where a discharge is not allowed to occur, and a dotted line with open squares indicates the case where a discharge is allowed to occur. Moreover, FIG. 4B shows variations in the impedance value when the input power from the sputtering power supply is changed. A dotted line with open diamonds indicates the case where a discharge is not allowed to occur, and a dotted line with open squares indicates the case where a discharge is allowed to occur. It should be noted that though a description will not be particularly made with reference to drawings, the following has been confirmed: in the case where a plasma is produced in a processing chamber using a high frequency power supply, the impedance value becomes low, and in the case where a bias voltage is applied to a substrate using a high frequency power supply during plasma processing, the impedance value decreases with increasing applied voltage.

Figure 5:
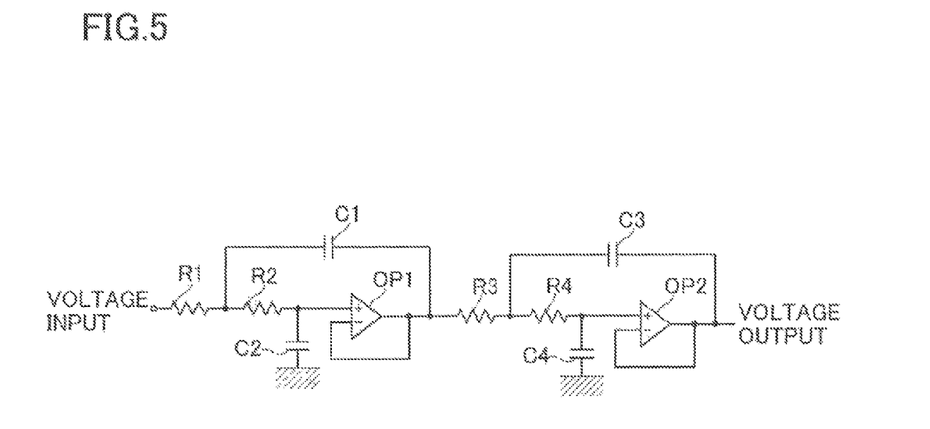
FIG. 5 is a view for explaining the configuration of removing means of the embodiment of the present invention.

Based on the above-described experimental results, in an embodiment of the present invention, a filter circuit F for removing AC components of specific frequencies is provided in the chuck power supply E (see FIG. 1). As the filter circuit F, as shown in FIG. 5, a so-called low pass filter is used which is formed by connecting circuits, each including resistors R1, R2 (R3, R4), capacitors C1, C2 (C3, C4), and an operational amplifier OP1 (OP2), in series. The low pass filter blocks a band of frequencies higher than a predetermined cutoff frequency. In this case, the cutoff frequency is appropriately selected according to components (type of the power supply and the presence or absence of application of a bias voltage) of the plasma processing system in which the substrate holding device EC is used, and process conditions (pressure in a processing chamber during plasma processing, and the type and flow rate of the gas introduced during processing).

Figure 6:
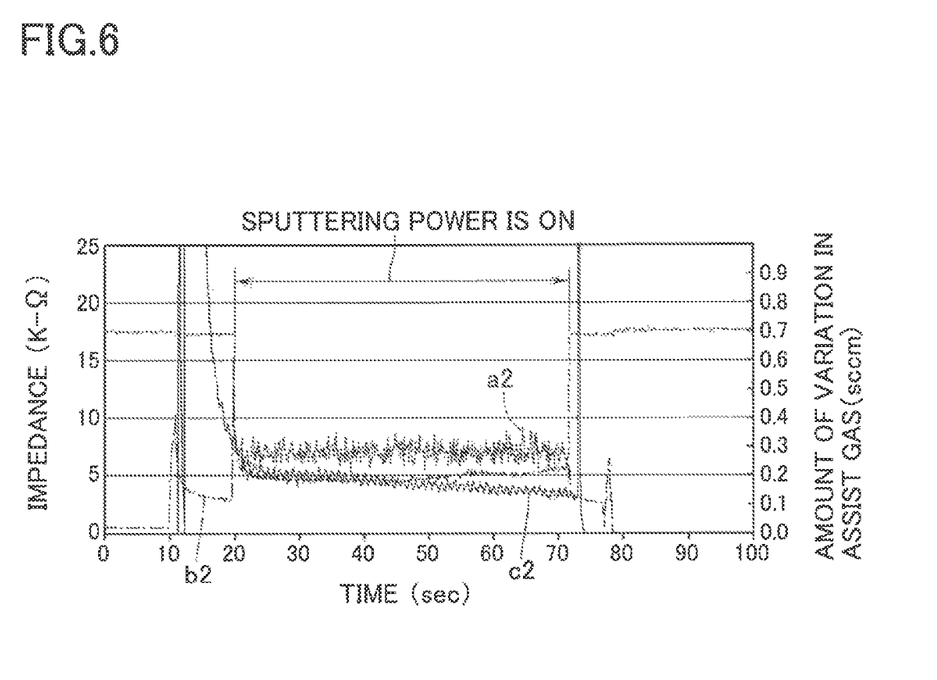
FIG. 6 is a graph showing results of an experiment in which variations in an impedance value, an alternating current value, and the flow rate of assist gas are measured during plasma processing in the case where the substrate holding device of the embodiment of the present invention is used.

To confirm the above-described effects, using the same sputtering system as in the above-described experiment, a film was formed on a wafer W under the same sputtering conditions. In this case, a circuit shown in FIG. 5 was used as a filter circuit F provided in the chuck power supply E. In this experiment, as shown in FIG. 6, it can be seen that immediately after the beginning of supply of power, the alternating current value measured with the ammeter M starts increasing, and the impedance value decreases, but the amount of the decrease thereof (approximately 9 kΩ) is small; during the supply of power from the sputtering power supply (during sputtering), the amount of variation in the impedance is also small. Here, in FIG. 6, a line a2 indicates the amount of variation in the impedance, a line b2 indicates the amount of variation in an alternating current, and a line c2 indicates the amount of variation in the flow rate of the assist gas. Moreover, as indicated by solid lines in FIGS. 4A and 4B, it can be seen that the impedance value varies little by changing the amount of sputtering gas introduced or the input power during sputtering. In FIG. 4A, a solid line with filled triangles indicates the case where a discharge is not allowed to occur, and a solid line with filled squares indicates the case where a discharge is allowed to occur. Moreover, in FIG. 4B, a solid line with filled triangles indicates the case where a discharge is not allowed to occur, and a solid line with filled squares indicates the case where a discharge is allowed to occur.

As described above, in this embodiment, by optimizing the filter circuit F, the state of a substrate (whether or not warpage has been caused by film stress, and the like) can be reliably grasped from variations in the impedance value without the influence of the AC component during plasma processing. Also, by the control means C controlling the DC voltage from the DC power supply E1 according to the amount of variation in the impedance during plasma processing, the substrate can be clamped with an optimum substrate clamping force. As a result, it is possible to prevent damage to a wafer W and the induction of an abnormal discharge during plasma processing. It should be noted that in the case where the control means C controls the DC voltage from the DC power supply E1 according to the amount of variation in the impedance during plasma processing, control can be performed by acquiring the amount of variation in the impedance at the pressure (or the amount of gas to be introduced during plasma processing) in the processing chamber in advance and compensating this amount of variation.

Moreover, in the above-described embodiment, a description has been made by taking as an example a configuration in which the filter circuit F is provided. However, the present invention is not limited to this. The removing means is not particularly limited as long as the removing means can filter out AC components in a specific frequency band. For example, a digital signal processor can be used which functions as a filter for removing AC components in a specific frequency band. Moreover, depending on the plasma processing system, a filter circuit and a digital signal processor can also be used in combination.

Moreover, though in the above-described embodiment a description has been made based on the experiments in the DC sputtering system, it has been confirmed that a wafer can be clamped and held with an optimum clamping force when the present invention is applied to a self-bias sputtering system or a reactive ion etching system. Moreover, it has also been confirmed that the uniformity of film thickness distribution across the surface of the wafer can be improved.

EXPLANATION OF REFERENCE NUMERALS

EC . . . substrate holding device (electrostatic chuck), 1 . . . chuck main body, 2 . . . chuck plate, 2a . . . rib portion, 2b . . . internal space, 2c . . . support portions, 3a and 3b . . . (positive and negative) electrode, 5, 6, 7 . . . gas introduction means, 9 . . . mass flow meter, C . . . control means, E1 . . . DC power supply, E2 . . . AC power supply, F . . . filter circuit (removing means), M . . . ammeter.

The invention claimed is:

1. A substrate holding device for clamping a substrate in a processing chamber in which plasma processing is carried out, the substrate holding device comprising:
a chuck main body having positive and negative electrodes;
a dielectric chuck plate having a rib portion capable of bringing a peripheral edge portion of the substrate into surface contact therewith, and multiple support portions provided upright and arranged at predetermined intervals in an internal space surrounded by the rib portion;
a DC power supply for applying a DC voltage between the two electrodes;
an AC power supply for passing an alternating current through capacitance of the chuck plate; first measuring means for measuring the alternating current passing through the capacitance of the chuck plate;
removing means for removing an AC component superimposed on the alternating current from a plasma produced in the processing chamber during the plasma processing; and
gas introduction means for introducing a predetermined gas into the internal space; and second measuring means for measuring a gas flow rate of the gas introduced into the internal space, wherein the control means controls the DC voltage applied between the two electrodes so that the gas flow rate measured with the second measuring means is in a predetermined range.

2. The substrate holding device according to claim 1, further comprising control means for controlling operation of the DC power supply and the AC power supply, wherein the control means controls the DC voltage applied between the two electrodes so that an alternating current value measured with the first measuring means is in a predetermined range.

3. The substrate holding device according to claim 1, wherein the removing means is any one of a filter circuit for filtering out AC components in a specific frequency band and a digital signal processor which functions as a filter for filtering out AC components in a specific frequency band.

* * * * *